US007719847B2

(12) United States Patent
Mambakkam et al.

(10) Patent No.: US 7,719,847 B2
(45) Date of Patent: May 18, 2010

(54) SMARTCONNECT FLASH CARD ADAPTER

(75) Inventors: Sreenath Mambakkam, San Jose, CA (US); Venkidu Arockiyaswamy, Menlo Park, CA (US); Larry Lawson Jones, Palo Alto, CA (US)

(73) Assignee: MCM Portfolio LLC, Cupertino, CA (US)

( * ) Notice: Subject to any disclaimer, the term of this patent is extended or adjusted under 35 U.S.C. 154(b) by 0 days.

(21) Appl. No.: 12/189,725

(22) Filed: Aug. 11, 2008

(65) Prior Publication Data

US 2008/0299809 A1 Dec. 4, 2008

Related U.S. Application Data

(63) Continuation of application No. 11/858,086, filed on Sep. 19, 2007, which is a continuation of application No. 11/492,556, filed on Jul. 24, 2006, now Pat. No. 7,295,443, which is a continuation of application No. 10/887,635, filed on Jul. 8, 2004, now Pat. No. 7,095, 618, which is a continuation-in-part of application No. 10/064,966, filed on Sep. 4, 2002, now Pat. No. 6,859, 369, which is a continuation-in-part of application No. 10/167,925, filed on Jun. 11, 2002, now Pat. No. 7,222, 205, which is a continuation of application No. 09/610, 904, filed on Jul. 6, 2000, now Pat. No. 6,438,638, said application No. 10/064,966 is a continuation-in-part of application No. 10/039,685, filed on Oct. 29, 2001, now Pat. No. 6,832,281, and a continuation-in-part of application No. 10/002,567, filed on Nov. 1, 2001, now abandoned.

(51) Int. Cl.
*H05K 7/02* (2006.01)

(52) U.S. Cl. ....................... 361/737; 235/492; 439/945; 439/638

(58) Field of Classification Search ................. 361/737, 361/730, 752; 439/945, 946, 638, 76.1; 235/492
See application file for complete search history.

(56) References Cited

U.S. PATENT DOCUMENTS 4,092,732 A 5/1978 Ouchi (Continued)

FOREIGN PATENT DOCUMENTS

DE 20109810 U 8/2001

(Continued)

OTHER PUBLICATIONS

Supplementary Search Report for EP Application No. 01952974.2, 3 pages, Sep. 21, 2004.

(Continued)

*Primary Examiner*—Dameon E Levi
(74) *Attorney, Agent, or Firm*—The TPL Group; Edward P. Heller, III

(57) ABSTRACT

A multi-memory media adapter having a port, a surface, and a set of contact pins adapted to connect to different types of flash cards. Signals are mapped to the contact pins depending upon the type of flash card. In one embodiment, a controller has signal lines connected to an interconnection means which connects wires, cables or traces to the sets of contact pins. Signals are mapped on the signal lines depending upon the type of flash card inserted.

3 Claims, 5 Drawing Sheets

U.S. PATENT DOCUMENTS

| | | | | | |
|---|---|---|---|---|---|
| 5,296,692 | A | | 3/1994 | Shino | |
| 5,394,206 | A | | 2/1995 | Cocca | |
| 5,396,617 | A | | 3/1995 | Villwock et al. | |
| 5,436,621 | A | | 7/1995 | Macko et al. | |
| 5,437,020 | A | | 7/1995 | Wells et al. | |
| 5,471,038 | A | | 11/1995 | Eisele et al. | |
| 5,485,606 | A | | 1/1996 | Midgdey | |
| 5,497,464 | A | | 3/1996 | Yeh | |
| 5,522,049 | A | | 5/1996 | Kimura et al. | |
| 5,538,436 | A | | 7/1996 | Garney | |
| 5,576,698 | A | | 11/1996 | Card et al. | |
| 5,584,043 | A | | 12/1996 | Burkart | |
| 5,589,719 | A | | 12/1996 | Fiset | |
| 5,594,233 | A | * | 1/1997 | Kenneth et al. | 235/492 |
| 5,596,562 | A | | 1/1997 | Chen | |
| 5,604,917 | A | | 2/1997 | Saito et al. | |
| 5,630,174 | A | | 5/1997 | Stone et al. | |
| 5,640,541 | A | | 6/1997 | Bartram et al. | |
| 5,679,007 | A | | 10/1997 | Potdevin et al. | |
| 5,708,799 | A | | 1/1998 | Gafken et al. | |
| 5,717,951 | A | | 2/1998 | Yabumoto | |
| 5,729,204 | A | | 3/1998 | Fackler et al. | |
| 5,734,894 | A | | 3/1998 | Adamson et al. | |
| 5,740,349 | A | | 4/1998 | Hasbun et al. | |
| 5,752,857 | A | | 5/1998 | Knights | |
| 5,786,769 | A | | 7/1998 | Coteus et al. | |
| 5,790,878 | A | | 8/1998 | Anderson et al. | |
| 5,799,200 | A | | 8/1998 | Brant et al. | |
| 5,802,553 | A | | 9/1998 | Robinson et al. | |
| 5,805,834 | A | | 9/1998 | McKinley et al. | |
| 5,815,426 | A | | 9/1998 | Jigour et al. | |
| 5,818,029 | A | | 10/1998 | Thomson | |
| 5,828,905 | A | | 10/1998 | Rao | |
| 5,844,910 | A | | 12/1998 | Niijima et al. | |
| 5,844,911 | A | | 12/1998 | Schadegg et al. | |
| 5,877,975 | A | | 3/1999 | Jigour et al. | |
| 5,887,145 | A | | 3/1999 | Harari et al. | |
| 5,892,213 | A | | 4/1999 | Ito et al. | |
| 5,905,888 | A | | 5/1999 | Jones et al. | |
| 5,928,347 | A | | 7/1999 | Jones | |
| 5,928,370 | A | | 7/1999 | Asnaashari | |
| 5,929,416 | A | | 7/1999 | Dos Santos Pato et al. | |
| 5,930,496 | A | | 7/1999 | MacLaren et al. | |
| 5,933,328 | A | | 8/1999 | Wallace et al. | |
| 5,956,473 | A | | 9/1999 | Ma et al. | |
| 5,961,652 | A | | 10/1999 | Thompson | |
| 5,964,885 | A | | 10/1999 | Little et al. | |
| 5,974,426 | A | | 10/1999 | Lee et al. | |
| D416,541 | S | | 11/1999 | Hirai et al. | |
| 5,995,376 | A | | 11/1999 | Schultz et al. | |
| 6,002,605 | A | | 12/1999 | Iwasaki et al. | |
| 6,006,295 | A | | 12/1999 | Jones et al. | |
| 6,009,492 | A | | 12/1999 | Matsuoka | |
| 6,010,066 | A | | 1/2000 | Itou et al. | |
| 6,011,741 | A | | 1/2000 | Wallace et al. | |
| 6,015,093 | A | | 1/2000 | Barrett et al. | |
| 6,026,007 | A | | 2/2000 | Jigour et al. | |
| 6,038,400 | A | | 3/2000 | Bell et al. | |
| 6,061,746 | A | | 5/2000 | Stanley et al. | |
| 6,062,887 | A | | 5/2000 | Schuster et al. | |
| 6,067,234 | A | | 5/2000 | Kim et al. | |
| 6,075,706 | A | | 6/2000 | Learmonth et al. | |
| 6,079,621 | A | | 6/2000 | Vardanyan et al. | |
| 6,088,755 | A | | 7/2000 | Kobayashi et al. | |
| 6,088,802 | A | | 7/2000 | Bialick et al. | |
| 6,097,605 | A | | 8/2000 | Klatt et al. | |
| 6,102,715 | A | | 8/2000 | Centofante | |
| 6,112,014 | A | | 8/2000 | Kane | |
| 6,132,223 | A | | 10/2000 | Seeley et al. | |
| 6,137,710 | A | | 10/2000 | Iwasaki et al. | |
| 6,145,046 | A | | 11/2000 | Jones | |
| 6,164,538 | A | * | 12/2000 | Furuya et al. | 235/449 |
| 6,170,029 | B1 | | 1/2001 | Kelley et al. | |
| 6,170,066 | B1 | | 1/2001 | See | |
| 6,173,291 | B1 | | 1/2001 | Jenevein | |
| 6,175,517 | B1 | | 1/2001 | Jigour et al. | |
| 6,182,162 | B1 | | 1/2001 | Estakhri et al. | |
| 6,189,055 | B1 | | 2/2001 | Eisele et al. | |
| 6,199,122 | B1 | | 3/2001 | Kobayashi | |
| 6,202,932 | B1 | | 3/2001 | Rapeli | |
| 6,203,378 | B1 | | 3/2001 | Shobara et al. | |
| 6,226,202 | B1 | | 5/2001 | Kikuchi | |
| 6,264,506 | B1 | | 7/2001 | Yasufuku et al. | |
| 6,266,724 | B1 | | 7/2001 | Harari et al. | |
| 6,279,069 | B1 | | 8/2001 | Robinson et al. | |
| 6,282,612 | B1 | | 8/2001 | Sakajiri et al. | |
| 6,292,863 | B1 | | 9/2001 | Terasaki et al. | |
| 6,317,352 | B1 | | 11/2001 | Halbert et al. | |
| 6,330,688 | B1 | | 12/2001 | Brown | |
| 6,353,870 | B1 | | 3/2002 | Mills et al. | |
| 6,381,662 | B1 | | 4/2002 | Harari et al. | |
| 6,385,677 | B1 | | 5/2002 | Yao | |
| 6,386,920 | B1 | * | 5/2002 | Sun | 439/630 |
| 6,402,259 | B2 | * | 6/2002 | Corio et al. | 303/20 |
| 6,402,558 | B1 | * | 6/2002 | Hung-Ju et al. | 439/638 |
| 6,405,323 | B1 | | 6/2002 | Lin et al. | |
| 6,408,352 | B1 | | 6/2002 | Hosaka et al. | |
| 6,413,108 | B2 | | 7/2002 | Centofante | |
| 6,426,801 | B1 | | 7/2002 | Reed | |
| 6,438,638 | B1 | * | 8/2002 | Jones et al. | 710/301 |
| 6,468,101 | B2 | | 10/2002 | Suzuki | |
| 6,470,284 | B1 | | 10/2002 | Oh et al. | |
| 6,482,029 | B2 | | 11/2002 | Nishimura | |
| 6,490,163 | B1 | | 12/2002 | Pua et al. | |
| 6,578,125 | B2 | | 6/2003 | Toba | |
| 6,581,830 | B1 | * | 6/2003 | Jelinek et al. | 235/441 |
| 6,599,147 | B1 | | 7/2003 | Mills et al. | |
| 6,601,124 | B1 | | 7/2003 | Blair | |
| 6,607,405 | B2 | * | 8/2003 | Nishimura | 439/630 |
| 6,612,492 | B1 | * | 9/2003 | Yen | 235/451 |
| 6,612,498 | B1 | * | 9/2003 | Lipponen et al. | 235/486 |
| 6,642,614 | B1 | * | 11/2003 | Chen | 257/690 |
| 6,658,202 | B1 | | 12/2003 | Battaglia et al. | |
| 6,658,516 | B2 | | 12/2003 | Yao | |
| 6,663,007 | B1 | | 12/2003 | Sun et al. | |
| 6,666,724 | B1 | | 12/2003 | Lwee | |
| 6,675,233 | B1 | | 1/2004 | Du et al. | |
| 6,684,283 | B1 | | 1/2004 | Harris et al. | |
| 6,705,529 | B1 | | 3/2004 | Kettunen et al. | |
| 6,718,274 | B2 | | 4/2004 | Huang et al. | |
| 6,738,259 | B2 | * | 5/2004 | Le et al. | 361/737 |
| 6,745,267 | B2 | | 6/2004 | Chen et al. | |
| 6,746,280 | B1 | * | 6/2004 | Lu et al. | 439/630 |
| 6,751,694 | B2 | | 6/2004 | Liu et al. | |
| 6,761,313 | B2 | | 7/2004 | Hsieh et al. | |
| 6,761,320 | B1 | * | 7/2004 | Chen | 235/492 |
| 6,780,062 | B2 | * | 8/2004 | Liu et al. | 439/630 |
| 6,808,424 | B2 | | 10/2004 | Kaneshiro et al. | |
| 6,830,474 | B2 | * | 12/2004 | Liu et al. | 439/489 |
| 6,832,281 | B2 | * | 12/2004 | Jones et al. | 710/301 |
| 6,839,864 | B2 | | 1/2005 | Mambakkam et al. | |
| 6,859,369 | B2 | * | 2/2005 | Mambakkam et al. | 361/737 |
| 6,915,956 | B2 | * | 7/2005 | Liu et al. | 235/492 |
| 6,973,535 | B2 | | 12/2005 | Bruner et al. | |
| 6,984,152 | B2 | | 1/2006 | Mowery et al. | |
| 7,062,584 | B1 | | 6/2006 | Worrell et al. | |
| 7,065,591 | B2 | | 6/2006 | Han et al. | |
| 7,093,161 | B1 | | 8/2006 | Mambakkam et al. | |
| 7,095,618 | B1 | | 8/2006 | Mambakkam et al. | |
| 7,114,659 | B2 | * | 10/2006 | Harari et al. | 235/492 |
| 7,222,205 | B2 | | 5/2007 | Jones et al. | |
| 7,252,240 | B1 | | 8/2007 | Jones et al. | |
| 7,278,051 | B2 | | 10/2007 | Mambakkam et al. | |
| 7,295,443 | B2 | * | 11/2007 | Mambakkam et al. | 361/737 |

| | | | | |
|---|---|---|---|---|
| 7,412,552 | B2 | 8/2008 | Jones et al. | |
| 7,493,437 | B1 * | 2/2009 | Jones et al. | 710/301 |
| 7,522,424 | B2 * | 4/2009 | Mambakkan et al. | 361/737 |
| 2001/0039603 | A1 | 11/2001 | Manowitz | |
| 2002/0032813 | A1 | 3/2002 | Hosaka et al. | |
| 2002/0069363 | A1 | 6/2002 | Winburn | |
| 2002/0178307 | A1 | 11/2002 | Pua et al. | |
| 2002/0185533 | A1 | 12/2002 | Shieh et al. | |
| 2003/0038177 | A1 | 2/2003 | Morrow | |
| 2003/0070112 | A1 | 4/2003 | York | |
| 2003/0074529 | A1 | 4/2003 | Crohas | |
| 2003/0084220 | A1 | 5/2003 | Jones et al. | |
| 2003/0093606 | A1 | 5/2003 | Mambakkam et al. | |
| 2003/0172263 | A1 | 9/2003 | Liu | |
| 2004/0027879 | A1 | 2/2004 | Chang | |
| 2004/0073736 | A1 | 4/2004 | Oh et al. | |
| 2006/0059385 | A1 | 3/2006 | Atri et al. | |
| 2006/0242460 | A1 | 10/2006 | Mambakkam et al. | |
| 2006/0253636 | A1 | 11/2006 | Jones et al. | |
| 2007/0180177 | A1 | 8/2007 | Jones et al. | |
| 2007/0288677 | A1 | 12/2007 | Mambakkam et al. | |
| 2008/0009196 | A1 | 1/2008 | Mambakkam et al. | |
| 2008/0017718 | A1 | 1/2008 | Jones et al. | |
| 2008/0250174 | A1 | 10/2008 | Jones et al. | |

FOREIGN PATENT DOCUMENTS

| | | | |
|---|---|---|---|
| EP | 0775964 | A2 | 5/1997 |
| EP | 0987876 | A2 | 3/2000 |
| EP | 1043884 | A1 | 10/2000 |
| EP | 1139208 | A1 | 10/2001 |
| GB | 2263000 | A | 7/1993 |
| JP | 6195524 | A | 7/1994 |
| JP | 8235028 | A | 9/1996 |
| JP | 11-15928 | | 1/1999 |
| JP | 1115928 | | 1/1999 |
| JP | 11053485 | A | 2/1999 |
| TW | 490889 | B | 6/2002 |
| WO | 9859298 | A1 | 12/1998 |
| WO | 0023936 | | 4/2000 |
| WO | 2004027617 | | 4/2004 |

OTHER PUBLICATIONS

Antec, Inc., "PhotoChute3 USB", product manual, pp. 1-18, available at least by Apr. 26, 1999.
Burge, Leland L., et al., "A Ubiquitous Stable Storage for Mobile Computing Devices," ACM, Proceedings of the 2001 ACM Symposium on Applied Computing, pp. 401-404, Mar. 2001.
CompactFlash Association, "CF+ and Compact Flash Specification," Rev. 1.4, 5 pages, Jul. 1999.
CQ Publishing of Japan, "Interface," pp. 52-131, Dec. 1, 1999 (article and English translation).
Twice.com, "Digital Imaging Well Exposed at RetailVision," 1 page, Apr. 26, 1999.
Lexmark Service Manual, 5000 and 5700 Color Jetprinter; 5770 Photo Jetprinter, 4093/4094, Oct. 2000, p. 5-3.
Lexar Media Web Pages—Parallel Port, Universal Readers, FAQ, Jumpshot, Jun. 5, 2000 (copy not available; previously submitted in parent U.S. Appl. No. 09/610,904).
Microtouch Smart Media to PCMCIA Adapter Product Sheet, Jun. 8, 2000 (copy not available; previously submitted in parent U.S. Appl. No. 09/610,904).
Actiontec, "CameraConnect Pro Parallel Port Flash Card Reader User's Manual," available at least by Oct. 28, 1999.
Actiontec, "CameraConnect Pro," available at least by Oct. 28, 1999.
DataFab Systems, Inc., "DataFab Systems Inc., Leading in Portable Storage Systems, Is Now Offering Dual-Slot CompactFlash and SmartMedia Card Reader," Sep. 10, 1999.
DataRescue sa/nv, Inc., "PhotoRescue User's Guide," rev. 1.0, pp. 1-8, 2001.
DataRescue sa/nv, Inc., DataRescue Home page, located at http://web.archive.org/web/20010722191109/http://datarescue.com, archived Jul. 22, 2001.
DataRescue sa/nv, Inc., DataRescue PhotoRescue™ Specifications, located at http://web.archive.org/ web/2001 0827073251/www.datarescue.com/photorescue/spec.htm, archived Aug. 27, 2001.
Galbraith, Rob, "Building the Ultimate Photo Recovery Kit", located at http://www.robgalbraith.com/bins/content_page.asp?cid=7-4419-4501, Jan. 23, 2002.
Jones, Larry Lawson et al., U.S. Appl. No. 11/003,185 entitled "Flashtoaster for Reading Several Types of Flash Memory Cards with or without a PC," filed Dec. 2, 2004.
Microtech International, Inc., "Microtech Delivers Industry's First 3 Slot SCSI Digital Film Reader," Jan. 5, 2000.
Microtech International, Inc., "Microtech Digital Photography Solutions," available at least by Feb. 26, 2000.
Microtech International, Inc., "Microtech PCD-47B SCSI Digital Film Reader/Writer," available at least by May 24, 2000.
Microtech International, Inc., "Microtech USB CameraMate Supports IBM Microdrive," Feb. 18, 1999.
Microtech International, Inc., "PCD-47 User's Manual," Version 1.1, available at least by May 24, 2000.
Ontrack Data International, Inc., "EasyRecoveryTM Professional Edition User Guide," pp. 1-45,2000.
Steve's Digicams, "CardMate PCF-100 User Review," Apr. 12, 1999.
Steve's Digicams, "Microtech USB CameraMate User Review," Sep. 5, 1999.
USPTO, Transaction History for U.S. Appl. No. 10/064,966, filed Sep. 4, 2002, now U.S. Patent No. 6,859,369.
USPTO, Transaction History for U.S. Appl. No. 10/887,635, filed Jul. 8, 2004, now U.S. Patent No. 7,095,618.
USPTO, Transaction History for U.S. Appl. No. 11/492,556, filed Jul. 24,2006, now U.S. Patent No. 7,295,443.
Galbraith, Rob, "Building the Ultimate Photo Recovery Kit," located at http://www.robgalbraith.com/bins/content_page.asp?cid=7-4419-4501, Jan. 23, 2002.
Ontrack Data International, Inc., "EasyRecovery™ Professional Edition User Guide," pp. 1-45, 2000.
USPTO Transaction History of U.S. Appl. No. 10/064,996, filed Sep. 4, 2002, entitled "Smartuniversal Flash Media Card Adapters," now U.S. Patent No. 6,859,369.
USPTO Transaction History of U.S. Appl. No. 10/887,635, filed Jul. 8, 2004, entitled "Smartconnect Universal Flash Media Card Adapters," now U.S. Patent No. 7,095,618.
USPTO Transaction History of U.S. Appl. No. 11/492,556, filed Jul. 24, 2006, entitled "Smartconnect Universal Flash Media Card Adapters," now U.S. Patent No. 7,295,443.
USPTO Transaction History of U.S. Appl. No. 11/858,086, filed Sep. 19, 2007, entitled "Smartconnect Universal Flash Media Card Adapters."
U.S. Appl. No. 11/003,185, Advisory Action dated Mar. 26, 2008, 2 pages total.
U.S. Appl. No. 11/003,185, RCE dated Apr. 4, 2008, 7 pages total.
U.S. Appl. No. 11/003,185, Final Office Action dated May 16, 2008, 9 pages total.
U.S. Appl. No. 11/003,185, Amendment and RCE dated Aug. 18, 2008, 14 pages total.
U.S. Appl. No. 11/003,185, Notice of Allowance dated Oct. 1, 2008, 4 pages total.
U.S. Appl. No. 11/003,185, Issue Fee Payment and Amendment after Allowance dated Dec. 22, 2008, 70 pages total.
U.S. Appl. No. 11/075,496, Preliminary Amendment dated Apr. 11, 2005, 11 pages total.
U.S. Appl. No. 11/075,496, Notice of Allowance dated May 29, 2007, 12 pages total.
U.S. Appl. No. 11/075,496, Comments on Statement of Reasons for Allowance dated Jul. 27, 2007, 4 pages total.
U.S. Appl. No. 11/075,496, Issue Fee Payment and Amendment after Allowance dated Aug. 16, 2007, 11 pages total.
U.S. Appl. No. 11/473,823, Office Action dated Sep. 19, 2007, 18 pages total.
U.S. Appl. No. 11/473,823, Amendment and dated Jan. 22, 2008, 16 pages total.
U.S. Appl. No. 11/473,823, Final Office Action dated May 14, 2008, 10 pages total.

U.S. Appl. No. 11/473,823, Amendment and dated Aug. 14, 2008, 13 pages total.
U.S. Appl. No. 11/473,823, Advisory Action dated Sep. 2, 2008, 6 pages total.
U.S. Appl. No. 11/473,823, Interview Summary dated Sep. 22, 2008, 3 pages total.
U.S. Appl. No. 11/473,823, Notice of Allowance dated Oct. 6, 2008, 6 pages total.
U.S. Appl. No. 11/473,823, Supplemental Notice of Allowance dated Nov. 20, 2008, 3 pages total.
U.S. Appl. No. 11/473,823, Issue Fee Payment and Amendment after Allowance dated Dec. 10, 2008, 69 pages total.
U.S. Appl. No. 11/473,823, Supplemental Amendment after Allowance dated Dec. 31, 2008, 5 pages total.
U.S. Appl. No. 11/473,823, Response to Amendment after Allowance dated Feb. 25, 2009, 4 pages total.
U.S. Appl. No. 11/479,523, Office Action dated Sep. 5, 2006, 17 pages total.
U.S. Appl. No. 11/479,523, Amendment dated Nov. 3, 2006, 16 pages total.
U.S. Appl. No. 11/479,523, Notice of Non-Compliant Amendment dated Nov. 21, 2006, 2 pages total.
U.S. Appl. No. 11/479,523, Withdrawl of Non-Compliant Amendment dated Jan. 18, 2007, 2 pages total.
U.S. Appl. No. 11/479,523, Final Office Action dated May 14, 2007, 17 pages total.
U.S. Appl. No. 11/479,523, Notice of Appeal and Pre-Appeal Brief Request dated Jul. 27, 2007, 11 pages total.
U.S. Appl. No. 11/479,523, Notice of Panel Decision dated Oct. 11, 2007, 2 pages total.
U.S. Appl. No. 11/479,523, Office Action dated Dec. 19, 2007, 13 pages total.
U.S. Appl. No. 11/479,523, Amendment dated Jan. 15, 2008, 12 pages total.
U.S. Appl. No. 11/479,523, Final Office Action dated Apr. 24, 2008, 24 pages total.
U.S. Appl. No. 11/479,523, Notice of Appeal and Pre-Appeal Brief Request dated Jun. 12, 2008, 12 pages total.
U.S. Appl. No. 11/479,523, Notice of Panel Decision from Pre-Appeal Brief Review dated Jul. 3, 2008, 2 pages total.
U.S. Appl. No. 11/479,523, Amendment and Appeal Brief dated Aug. 12, 2008, 26 pages total.
U.S. Appl. No. 11/479,523, Notice of Non-Compliant Appeal Brief dated Nov. 3, 2008, 2 pages total.
U.S. Appl. No. 11/479,523, Amended Appeal Brief dated Dec. 2, 2008, 21 pages total.
U.S. Appl. No. 11/479,523, Examiner's Answer dated Feb. 13, 2009, 23 pages total.
U.S. Appl. No. 11/479,523, Reply Brief dated Apr. 10, 2009, 7 pages total.
U.S. Appl. No. 11/479,523, Notice of Noted Reply Brief dated Jun. 10, 2009, 2 pages total.
U.S. Appl. No. 11/479,523, Order Returning Undocketed Appeal dated Jun. 15, 2009, 3 pages total.
U.S. Appl. No. 11/479,523, Response to Order Returning Undocketed Appeal dated Jul. 1, 2009, 2 pages total.
U.S. Appl. No. 11/479,523, Filed Terminal Disclaimers dated Jul. 15, 2009, 4 pages total.
U.S. Appl. No. 11/492,556, Office Action dated Nov. 2, 2006, 8 pages total.
U.S. Appl. No. 11/492,556, Amendment dated Feb. 2, 2007, 12 pages total.
U.S. Appl. No. 11/492,556, Final Office Action dated May 16, 2007, 12 pages total.
U.S. Appl. No. 11/492,556, Amendment dated May 22, 2007, 11 pages total.
U.S. Appl. No. 11/492,556, Notice of Allowance dated Jul. 3, 2007, 8 pages total.
U.S. Appl. No. 11/492,556, Comments on Reasons for Allowance and Amendment after Allowance dated Jul. 18, 2007, 11 pages total.
U.S. Appl. No. 11/492,556, Amendment after Allowance dated Sep. 7, 2007, 5 pages total.
U.S. Appl. No. 11/492,556, Issue Fee Payment dated Sep. 19, 2007, 5 pages total.
U.S. Appl. No. 09/610,904, Preliminary Amendment dated May 20, 2002, 7 pages total.
U.S. Appl. No. 09/610,904, Notice of Allowance dated May 31, 2002, 5 pages total.
U.S. Appl. No. 09/610,904, Issue Fee Payment dated Jun. 6, 2002, 1 pages total.
U.S. Appl. No. 10/002,567, Preliminary Amendment dated Jun. 11, 2002, 6 pages total.
U.S. Appl. No. 10/002,567, Office Action dated May 12, 2004, 20 pages total.
U.S. Appl. No. 10/002,567, Notice of Abandonment and Interview Summary dated Dec. 1, 2004, 4 pages total.
U.S. Appl. No. 10/039,685, Preliminary Amendment dated Jun. 11, 2002, 4 pages total.
U.S. Appl. No. 10/039,685, Office Action dated May 24, 2004, 12 pages total.
U.S. Appl. No. 10/039,685, Amendment dated Aug. 20, 2004, 17 pages total.
U.S. Appl. No. 10/039,685, Notice of Allowance dated Sep. 13, 2004, 7 pages total.
U.S. Appl. No. 10/039,685, Issue Fee Payment dated Nov. 4, 2004, 7 pages total.
U.S. Appl. No. 10/063,021, Preliminary Amendment dated Jun. 11, 2002, 4 pages total.
U.S. Appl. No. 10/063,021, Office Action dated May 19, 2003, 6 pages total.
U.S. Appl. No. 10/063,021, Amendment dated Aug. 19, 2003, 10 pages total.
U.S. Appl. No. 10/063,021, Office Action dated Dec. 29, 2003, 5 pages total.
U.S. Appl. No. 10/063,021, Amendment dated Apr. 16, 2004, 14 pages total.
U.S. Appl. No. 10/063,021, Office Action dated Jul. 28, 2004, 12 pages total.
U.S. Appl. No. 10/063,021, Amendment dated Oct. 27, 2004, 14 pages total.
U.S. Appl. No. 10/063,021, Final Office Action dated Jan. 26, 2005, 12 pages total.
U.S. Appl. No. 10/063,021, Amendment and RCE dated May 3, 2005, 21 pages total.
U.S. Appl. No. 10/063,021, Office Action dated Jul. 28, 2005, 11 pages total.
U.S. Appl. No. 10/063,021, Amendment dated Nov. 22, 2005, 15 pages total.
U.S. Appl. No. 10/063,021, Office Action dated Mar. 10, 2006, 12 pages total.
U.S. Appl. No. 10/063,021, Amendment dated Jun. 12, 2006, 16 pages total.
U.S. Appl. No. 10/063,021, Notice of Allowance dated Oct. 2, 2006, 9 pages total.
U.S. Appl. No. 10/063,021, Issue Fee Payment dated Dec. 4, 2006, 3 pages total.
U.S. Appl. No. 10/063,021, Notice of Abandonment dated Feb. 2, 2007, 2 pages total.
U.S. Appl. No. 10/063,021, Petition for Revival dated Feb. 7, 2007, 11 pages total.
U.S. Appl. No. 10/063,021, Decision on Petition for Revival dated Jun. 26, 2007, 1 page total.
U.S. Appl. No. 10/063,021, Notice of Drawing Inconsistency dated Jul. 6, 2007, 2 pages total.
U.S. Appl. No. 10/063,021, Response to Notice of Drawing Inconsistency dated Jul. 13, 2007, 5 pages total.
U.S. Appl. No. 10/064,966, Office Action dated Oct. 29, 2003, 11 pages total.
U.S. Appl. No. 10/064,966, Amendment dated Jan. 14, 2004, 13 pages total.
U.S. Appl. No. 10/064,966, Notice of Allowance dated Apr. 6, 2004, 22 pages total.
U.S. Appl. No. 10/064,966, Issue Fee Payment and Formal Drawings dated Jul. 6, 2004, 10 pages total.

U.S. Appl. No. 10/064,967, Office Action dated Aug. 24, 2005, 27 pages total.
U.S. Appl. No. 10/064,967, Amendment dated Jan. 24, 2006, 25 pages total.
U.S. Appl. No. 10/064,967, Notice of Allowance dated Mar. 17, 2006, 19 pages total.
U.S. Appl. No. 10/064,967, Issue Fee Payment dated Jun. 16, 2006, 2 pages total.
U.S. Appl. No. 10/167,925, Office Action dated Jan. 22, 2003, 11 pages total.
U.S. Appl. No. 10/167,925, Amendment dated Feb. 10, 2003, 8 pages total.
U.S. Appl. No. 10/167,925, Office Action dated Jun. 18, 2003, 10 pages total.
U.S. Appl. No. 10/167,925, Amendment dated Aug. 29, 2003, 14 pages total.
U.S. Appl. No. 10/167,925, Final Office Action dated Oct. 27, 2003, 7 pages total.
U.S. Appl. No. 10/167,925, Amendment and RCE dated Nov. 17, 2003, 16 pages total.
U.S. Appl. No. 10/167,925, Office Action dated Jan. 16, 2004, 6 pages total.
U.S. Appl. No. 10/167,925, Amendment dated Apr. 16, 2004, 11 pages total.
U.S. Appl. No. 10/167,925, Final Office Action dated Jun. 24, 2004, 11 pages total.
U.S. Appl. No. 10/167,925, Amendment and RCE dated Nov. 23, 2004, 17 pages total.
U.S. Appl. No. 10/167,925, Office Action dated Jan. 24, 2005, 9 pages total.
U.S. Appl. No. 10/167,925, Amendment dated Feb. 18, 2005, 15 pages total.
U.S. Appl. No. 10/167,925, Final Office Action No. 3 dated May 17, 2005, 12 pages total.
U.S. Appl. No. 10/167,925, Notice of Abandonment dated Dec. 14, 2005, 2 pages total.
U.S. Appl. No. 10/167,925, Amendment, RCE and Petition for Revival dated Dec. 20, 2005, 14 pages total.
U.S. Appl. No. 10/167,925, Decision on Petition for Revival dated Apr. 5, 2006, 1 page total.
U.S. Appl. No. 10/167,925, Restriction Requirement dated May 4, 2006, 4 pages total.
U.S. Appl. No. 10/167,925, Response to Restriction Requirement dated Jun. 9, 2006, 6 pages total.
U.S. Appl. No. 10/167,925, Office Action dated Jul. 7, 2006, 20 pages total.
U.S. Appl. No. 10/167,925, Amendment dated Oct. 10, 2006, 10 pages total.
U.S. Appl. No. 10/167,925, Final Office Action dated Oct. 25, 2006, 16 pages total.
U.S. Appl. No. 10/167,925, Amendment and RCE dated Jan. 29, 2007, 16 pages total.
U.S. Appl. No. 10/167,925, Notice of Allowance dated Feb. 23, 2007, 27 pages total.
U.S. Appl. No. 10/167,925, Issue Fee Payment dated Mar. 30, 2007, 4 pages total.
U.S. Appl. No. 10/253,547, Office Action dated Jan. 8, 2004, 13 pages total.
U.S. Appl. No. 10/253,547, Amendment dated Jul. 27, 2004, 11 pages total.
U.S. Appl. No. 10/253,547, Notice of Allowance dated Sep. 29, 2004, 5 pages total.
U.S. Appl. No. 10/253,547, Issue Fee Payment dated Nov. 4, 2004, 3 pages total.
U.S. Appl. No. 10/264,466, Preliminary Amendment dated Jan. 7, 2003, 3 pages total.
U.S. Appl. No. 10/264,466, Restriction Requirement dated Jan. 29, 2004, 5 pages total.
U.S. Appl. No. 10/264,466, Response to Restriction Requirement dated Mar. 19, 2004, 4 pages total.
U.S. Appl. No. 10/264,466, Office Action dated May 4, 2004, 12 pages total.
U.S. Appl. No. 10/264,466, Amendment dated Aug. 4, 2004, 17 pages total.
U.S. Appl. No. 10/264,466, Notice of Non-Compliant Election/Restriction dated Oct. 28, 2004, 12 pages total.
U.S. Appl. No. 10/264,466, Response to Non-Compliant Election/Restriction dated Nov. 17, 2004, 10 pages total.
U.S. Appl. No. 10/264,466, Interview Summary dated Dec. 30, 2004, 3 pages total.
U.S. Appl. No. 10/264,466, Notice of Non-Compliant Amendment dated Feb. 10, 2005, 5 pages total.
U.S. Appl. No. 10/264,466, Response to Non-Compliant Amendment dated Mar. 10, 2005, 4 pages total.
U.S. Appl. No. 10/264,466, Final Office Action dated Jun. 3, 2005, 13 pages total.
U.S. Appl. No. 10/264,466, Amendment and RCE dated Nov. 3, 2005, 12 pages total.
U.S. Appl. No. 10/264,466, Office Action dated Jan. 27, 2006, 12 pages total.
U.S. Appl. No. 10/264,466, Amendment dated May 30, 2006, 14 pages total.
U.S. Appl. No. 10/264,466, Interview Summary dated Jun. 8, 2006, 3 pages total.
U.S. Appl. No. 10/264,466, Notice of Allowance dated Sep. 5, 2006, 12 pages total.
U.S. Appl. No. 10/264,466, Issue Fee Payment dated Dec. 4, 2006, 5 pages total.
U.S. Appl. No. 10/887,635, Office Action dated May 27, 2005, 13 pages total.
U.S. Appl. No. 10/887,635, Amendment dated May 27, 2005, 11 pages total.
U.S. Appl. No. 10/887,635, Final Office Action dated Nov. 25, 2005, 17 pages total.
U.S. Appl. No. 10/887,635, Amendment and RCE dated Feb. 27, 2006, 12 pages total.
U.S. Appl. No. 10/887,635, Notice of Allowance dated Apr. 7, 2006, 22 pages total.
U.S. Appl. No. 10/887,635, Issue Fee Payment and Formal Drawings dated Jun. 27, 2006, 10 pages total.
U.S. Appl. No. 11/003,185, Office Action dated Aug. 15, 2006, 13 pages total.
U.S. Appl. No. 11/003,185, Amendment dated Nov. 13, 2006, 12 pages total.
U.S. Appl. No. 11/003,185, Final Office Action dated Mar. 16, 2007, 15 pages total.
U.S. Appl. No. 11/003,185, Amendment and RCE dated Sep. 17, 2007, 17 pages total.
U.S. Appl. No. 11/003,185, Office Action dated Sep. 25, 2007, 10 pages total.
U.S. Appl. No. 11/003,185, Amendment dated Oct. 4, 2007, 17 pages total.
U.S. Appl. No. 11/003,185, Interview Summary dated Oct. 29, 2007, 3 pages total.
U.S. Appl. No. 11/003,185, Final Office Action dated Nov. 7, 2007, 9 pages total.
U.S. Appl. No. 11/003,185, Statement of the Substance of the Interview dated Dec. 7, 2007, 3 pages total.
U.S. Appl. No. 11/003,185, Amendment dated Mar. 7, 2008, 18 pages total.
U.S. Appl. No. 11/492,556, Response to Amendment after Allowance dated Oct. 5, 2007, 2 pages total.
U.S. Appl. No. 11/671,410, Preliminary Amendment dated Oct. 31, 2007, 8 pages total.
U.S. Appl. No. 11/671,410, Office Action dated Dec. 7, 2007, 31 pages total.
U.S. Appl. No. 11/671,410, Amendment dated Mar. 21, 2008, 14 pages total.
U.S. Appl. No. 11/671,410, Interview Summary dated Mar. 28, 2008, 2 pages total.
U.S. Appl. No. 11/671,410, Statement of the Substance of the Interview dated Apr. 28, 2008, 3 pages total.
U.S. Appl. No. 11/671,410, Notice of Allowance dated May 23, 2008, 21 pages total.

U.S. Appl. No. 11/671,410, Issue Fee Payment and Amendment after Allowance dated Jun. 13, 2008, 14 pages total.
U.S. Appl. No. 11/671,410, Interview Summary dated Jul. 10, 2008, 5 pages total.
U.S. Appl. No. 11/671,410, Response to Amendment after Allowance dated Jul. 15, 2008, 3 pages total.
U.S. Appl. No. 11/694,846, Preliminary Amendment dated Oct. 31, 2007, 10 pages total.
U.S. Appl. No. 11/694,846, Office Action dated Jan. 17, 2008, 42 pages total.
U.S. Appl. No. 11/694,846, Amendment dated Apr. 15, 2008, 17 pages total.
U.S. Appl. No. 11/694,846, Final Office Action dated Jul. 3, 2008, 36 pages total.
U.S. Appl. No. 11/694,846, Notice of Related Applications dated Nov. 19, 2008, 8 pages total.
U.S. Appl. No. 11/694,846, Amendment and RCE dated Dec. 3, 2008, 33 pages total.
U.S. Appl. No. 11/694,846, Office Action dated Dec. 22, 2008, 33 pages total.
U.S. Appl. No. 11/694,846, Amendment dated May 22, 2009, 16 pages total.
U.S. Appl. No. 11/829,766, Office Action dated Oct. 20, 2008, 32 pages total.
U.S. Appl. No. 11/829,766, Amendment dated Feb. 20, 2009, 15 pages total.
U.S. Appl. No. 11/829,766, Notice of Allowance dated Jun. 1, 2009, 13 pages total.
U.S. Appl. No. 11/844,330, Office Action dated Mar. 27, 2008, 5 pages total.
U.S. Appl. No. 11/844,330, Amendment dated Jul. 28, 2008, 13 pages total.
U.S. Appl. No. 11/844,330, Office Action dated Nov. 14, 2008, 7 pages total.
U.S. Appl. No. 11/844,330, Notice of Related Applications dated Nov. 19, 2008, 7 pages total.
U.S. Appl. No. 11/844,330, Amendment dated Apr. 13, 2009, 16 pages total.
U.S. Appl. No. 11/858,086, Preliminary Amendment dated Nov. 15, 2007, 21 pages total.
U.S. Appl. No. 11/858,086, Office Action dated Mar. 14, 2008, 27 pages total.
U.S. Appl. No. 11/858,086, Amendment dated Apr. 4, 2008, 114 pages total.
U.S. Appl. No. 11/858,086, Notice of Allowance dated May 22, 2008, 9 pages total.
U.S. Appl. No. 11/858,086, Issue Fee Payment dated Jun. 30, 2008, 5 pages total.
U.S. Appl. No. 12/139,425, Notice of Related Applications dated Nov. 19, 2008, 17 pages total.
U.S. Appl. No. 12/139,425, Preliminary Amendment dated Dec. 18, 2008, 51 pages total.
U.S. Appl. No. 12/139,425, Notice of Non-Compliant Amendment dated Jan. 28, 2009, 3 pages total.
U.S. Appl. No. 12/139,425, Response to Non-Compliant Amendment dated Feb. 4, 2009, 9 pages total.
U.S. Appl. No. 12/329,485, Preliminary Amendment and Notice of Related Applications dated Dec. 10, 2008, 13 pages total.
U.S. Appl. No. 12/329,485, Preliminary Amendment dated Jan. 16, 2009, 5 pages total.
U.S. Appl. No. 12/342,029, Notice of Related Applications dated Jan. 13, 2009, 18 pages total.
U.S. Appl. No. 12/342,029, Office Action dated May 27, 2009, 12 pages total.
U.S. Appl. No. 11/694,846, Final Office Action dated Aug. 11, 2009, 31 pages total.
SCM Microsystems; "SCSI Interface: PCD-47 series"; SCM Microsystems; archived from www.scmmicro.com on May 1,1999; 2 pages.
SCM Microsystems; "PC Card Reader/Writer PCD-47/PCD-47BH"; SCM Microsystems; available at least by May 1, 1999; 35 pages.
European Application No. 09005852.0, Extended European Search Report, Jul. 1, 2009, 5 pages.

* cited by examiner

CONNECTOR PINS

| PIN | SMART MEDIA | MMC/ SD | MEMORY STICK |
|---|---|---|---|
| 1 | D0/-WPSW | | |
| 2 | D1 | -WP | |
| 3 | D2 | -CD | |
| 4 | D3 | MCMD | |
| 5 | D4 | | -CD |
| 6 | D5 | | BS |
| 7 | D6 | | SDIO |
| 8 | D7 | | |
| 9 | LVD | | |
| 10 | -WE | D0 | |
| 11 | -RE | D1 | |
| 12 | -ALE | D2 | |
| 13 | -CLE | D3 | |
| 14 | READY | | |
| 15 | -CE | | |
| 16 | -WP | | |
| 17 | -WPSW | | |
| 18 | GROUND | GROUND | GROUND |
| 19 | POWER | | |
| 20 | | POWER | POWER |
| 21 | | CLK | MCLK |

| PIN | XD | MMC/ SD (REGULAR SIZE) | MEMORY STICK (REGULAR SIZE) | SMART MEDIA | MINISD | RS MMC | MEMORY STICK DUO |
|---|---|---|---|---|---|---|---|
| 1 | GROUND | GROUND | GROUND | GROUND | GROUND | GROUND | GROUND |
| 2 | -CD1 | | | | | | |
| 3 | RDY | MCMD | BS | RDY | MCMD | MCMD | BS |
| 4 | -RE | SD0 | SDIO (MSD0) | -RE | SDD0 | SDD0 | SDIO (MSD0) |
| 5 | -CS | SD1 | MSD1 | -CS | SDD1 | SDD1 | MSD1 |
| 6 | CLE | SD2 | MSD2 | CLE | SDD2 | SDD2 | MSD2 |
| 7 | ALE | SD3 | MSD3 | ALE | SDD3 | SDD3 | MSD3 |
| 8 | -WE | CLK | CLK | -WE | CLK | CLK | CLK |
| 9 | WP | -WP | | WP | | | |
| 10 | D0 | -CD2 | | D0 | | | |
| 11 | D1 | | -CD3 | D1 | | | |
| 12 | D2 | | | D2/-CD4 | | | |
| 13 | D3 | | | D3 | -CD5 | | |
| 14 | D4 | | | D4 | | -CD6 | |
| 15 | D5 | | | D5 | | | -CD7 |
| 16 | D6 | | | D6/-WPSW | | | |
| 17 | D7 | | | D7/LVD | | | |
| 18 | POWER | POWER | POWER | POWER | POWER | POWER | POWER |

*FIG. 5*

SMARTCONNECT FLASH CARD ADAPTER

Under 35 U.S.C. §120, this application is a continuation of U.S. application Ser. No. 11/858,086, filed Sep. 19, 2007, which is a continuation of U.S. application Ser. No. 11/492,556, filed Jul. 24, 2006, now U.S. Pat. No. 7,295,443, which is a continuation of U.S. application Ser. No. 10/887,635 filed Jul. 8, 2004, now U.S. Pat. No. 7,095,618, which is a continuation-in-part application of U.S. application Ser. No. 10/064,966, which was filed on Sep. 4, 2002, now U.S. Pat. No. 6,859,369, which is a continued-in-part continuation-in-part application of U.S. application Ser. No. 10/167,925, which was filed on Jun. 11, 2002, now U.S. Pat. No. 7,222,205, which is a continuation application of U.S. application Ser. No. 09/610,904 which was filed Jul. 6, 2000, now U.S. Pat. No. 6,438,638, and is titled "Flashtoaster for reading several types of flash memory cards with or without a PC." U.S. application Ser. No. 10/064,966 is also a continuation-in-part of U.S. application Ser. No. 10/039,685 which was filed Oct. 29, 2001, now U.S. Pat. No. 6,832,281 and is titled, "Flashtoaster for reading several types of flash memory cards with or without a PC" and a continuation-in-part of U.S. application Ser. No. 10/002,567 which was filed Nov. 1, 2001 and is titled, "Active Adapter Chip for Use in a Flash Card Reader." The priority of the above-referenced applications is hereby claimed, and the entireties of the above-referenced applications are incorporated herein by this reference, and all of the above-referenced applications are assigned to the assignee of the present invention.

1. FIELD

The present invention relates generally to flash media adapters, and more specifically to an improved configuration of the same.

2. BACKGROUND

In U.S. patent application Ser. No. 10/002,567, entitled "Active Adapter Chip for Use in a Flash Card Reader", filed Nov. 1, 2001, and assigned to the assignee of the present application, a universal active adapter chip is disclosed that can be used to construct a flash media system or various active flash media adapters using the CompactFlash card or PCMCIA (PC Card) form factor. A standard reader that reads CompactFlash cards or PC cards can then read any of the other flash-memory cards that plug into the CompactFlash or PC Card adapter. The adapters come with a conversion chip that makes each of the flash media work just like a CompactFlash or PC Card media, as applicable.

FIG. 1 shows a multi-standard card reader system 142. In the field of multi-standard adapters, multi-memory media adapter 140 may be an active adapter or, alternatively, may be a passive adapter. Reader 142 can adapt on the host side to either CompactFlash card 149, PCMCIA card 153, or IDE card 151. On the media side, the reader can adapt to a MultiMediaCard 141, or a Secure Digital card 143, which have the same form factor but slightly different pin-out; a SmartMedia card 145, which has a different pin-out; or a Memory Stick 147. In general, the reader 142 can adapt to any generic flash media 146 that has a similar or smaller form factor.

It is possible to place the connector such that all the media sit in one opening. FIG. 2 is a cutaway side view of a PCMCIA adapter card 200 of the type that is available as a standard commercial product today. FIG. 2 illustrates several drawbacks in the typical configuration of a PCMCIA adapter. Adapter 200 includes two PCBs, namely PCB 210 and PCB 220. The two PCBs are separated by a mounting frame (typically plastic), not shown. The mounting frame acts as a spacer between PCB 210 and PCB 220, which holds the two PCBs together at a specified distance and functions in other capacities as described below. The space between the two PCBs creates the opening (port) 211 into which the flash media cards are inserted. PCB 230 is straddle-mounted between PCB 210 and PCB 220. PCB 230 contains the active components including controller chip 231 that perform handshaking and data transfer. PCB 230 is connected to a PCMCIA connector 240. PCB 230 is mounted between PCB 210 and PCB 220 with interconnects 212. PCB 210 has two sets of floating contact pins, contact pin set 214 includes nine contact pins and contact pin set 215 includes ten contact pins, which provide interfaces for MMC/SD and MemoryStick flash media respectively. PCB 220 has two sets of floating contact pins 224 and 225, each including 11 pins, which together provide the interface for SmartMedia flash media.

The mounting frame that holds PCB 210 and 220 together is configured such that each type of flash media is inserted in a particular location within the connector. In FIG. 2, opening 211 is a simplified view. Typically, the opening is stepped with different widths and heights in different locations that index the flash media cards into specific locations upon insertion. This allows each flash medium to be properly aligned with the corresponding contact pin set(s). Additionally, stops are typically provided to stop the insertion at the correct depth, again, to guarantee connection to the right contact pin set.

This typical approach has several serious drawbacks.

Manufacturing

The straddle-mount configured flash media adapter is very expensive to manufacture for several reasons. Often such devices require manual labor for manufacturing and testing, or the use of very expensive soldering robots, instead of standard production techniques. A further problem is the additive effect of manufacturing tolerances, such as primary connector (i.e., PCMCIA) to PCB, to straddle mount connector to secondary PCB to contacts on PCB, resulting in as many as two, three, or in some cases even four tolerances adding up, which makes requirements for tolerances either absurdly expensive, or causes a big yield problem in manufacturing. Additionally, PCB 230 must be thin enough so that it can be mounted between PCB 210 and PCB 220 in the space allocated for the insertion of the various flash media. That is, PCB 230, together with the interconnects 212 that mount it between PCB 210 and PCB 220 must be no larger than opening 211. The manufacture of thin PCBs to accommodate this design point adds to the expense and complexity of manufacturing the flash media adapter.

Contact Pins

The floating contact pins are subject to damage and deterioration. The various flash media cards have different thickness, and even the same flash media may have different thickness if produced by different manufacturers. The flash media cards exert pressure upon the floating contact pins, which eventually causes their resiliency to be reduced. When subsequently, a thinner flash media card is inserted into the flash media adapter, the corresponding contact pins may not make connection with the flash media card. Additionally if a flash media card is inserted incorrectly (e.g., upside down), removal of the flash media card may damage the contact pins.

Interface

Some devices don't have the 68-pin PCMCIA interface. For example, some recent notebook computer models only have the electrically equivalent 50-pin CF interface. Typical adapter cards such as PCMCIA adapter card 200 are incompatible with a 50-pin CF interface.

SUMMARY

An embodiment of the present invention provides a multi-memory media adaptor comprised of a first planar element having an upper surface and a lower surface and a second planar element having an upper surface and a lower surface. The two planar elements are formed from a single piece of molded plastic and disposed so as to form a port capable of receiving a memory media card. The adapter has at least one set of contact pins protruding from the lower surface of the first planar element or the upper surface of the second planar element such that the at least one set of contact pins are disposed within the port. The at least one set of contact pins are capable of contacting the contacts of a memory media card inserted into the port.

Other features and advantages of embodiments of the present invention will be apparent from the accompanying drawings, and from the detailed description, that follows below.

BRIEF DESCRIPTION OF THE DRAWINGS

The invention may be best understood by referring to the following description and accompanying drawings that are used to illustrate embodiments of the invention. In the drawings:

FIG. 5 is a table of pin mappings for the xD, standard MMC/SD, standard Memory Stick, SmartMedia, miniSD, RSMMC, and MS Duo to an 18-pin connector in accordance with one embodiment of the present invention;

DETAILED DESCRIPTION

Figure 1:
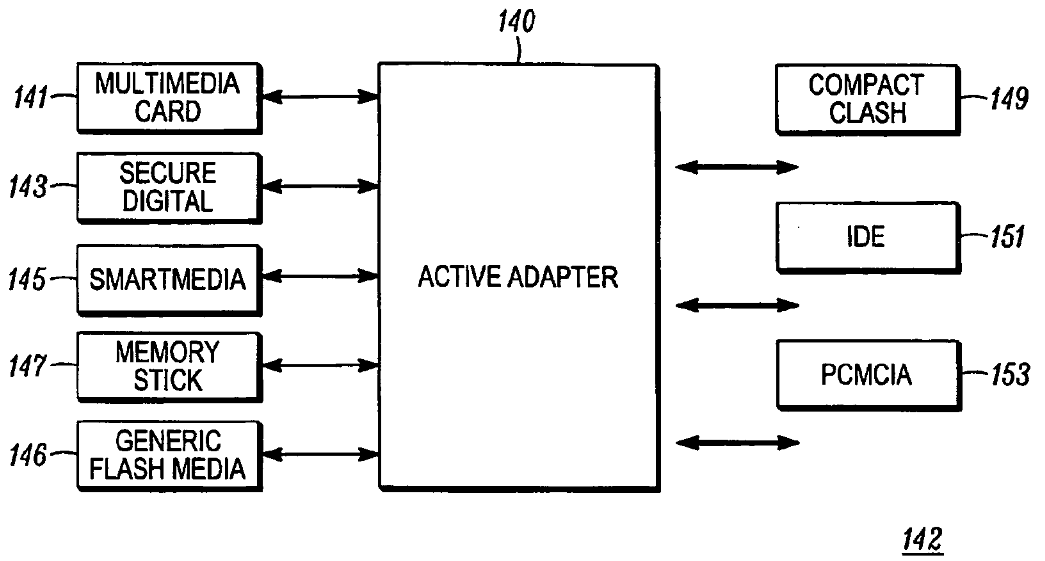
(PRIOR ART) FIG. 1
FIG. 1 illustrates a multi-standard card reader system.
Figure 2:
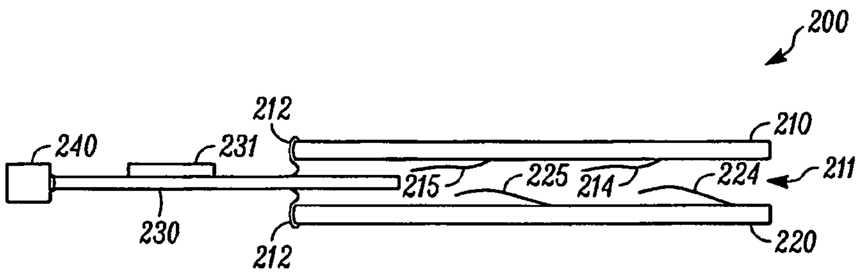
(PRIOR ART) FIG. 2
FIG. 2 is a cutaway side view of a PCMCIA adapter card of the type that is available as a standard commercial product today.

An embodiment of the present invention provides a multi-memory media adapter card configured to reduce or eliminate some of the drawbacks of typical adapter card configuration. In accordance with various embodiments of the present invention, the top and bottom PCBs of prior art configurations are replaced by molded plastic elements that provide greater structural integrity. The straddle-mounted controller board is replaced with a PCB adjacent to the bottom element and having a surface mounted standard connector that may be a PCMCIA or a CompactFlash connector. The contact pins are formed so as to better maintain their resiliency and avoid damage upon removal of the memory media card. In one embodiment, a light pipe is locked in place between the top and bottom elements of the adapter card so as to conduct light from a signal lamp on the PCB through the port.

It is an intended advantage of one embodiment of the present invention to reduce the manufacturing cost and complexity of an adapter card. It is another intended advantage of one embodiment of the present invention to provide an adapter card with greater structural integrity. It is another intended advantage of one embodiment of the present invention to provide an adapter card with contact pins that retain their resiliency to a greater degree than floating contact pins. It is another intended advantage of one embodiment of the present invention to provide an adapter card with contact pins that are less likely to be damaged upon removal of a memory media card. It is another intended advantage of one embodiment of the present invention to provide an adapter card with a surface mounted standard connector including PCMCIA and CompactFlash connectors.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to “one embodiment” or “an embodiment” means that a particular feature, structure, or characteristic described in connection with the embodiment is included in at least one embodiment of the present invention. Thus, the appearance of the phrases “in one embodiment” or “in an embodiment” in various places throughout the specification are not necessarily all referring to the same embodiment. Furthermore, the particular features, structures, or characteristics may be combined in any suitable manner in one or more embodiments.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Figures 3, 4:
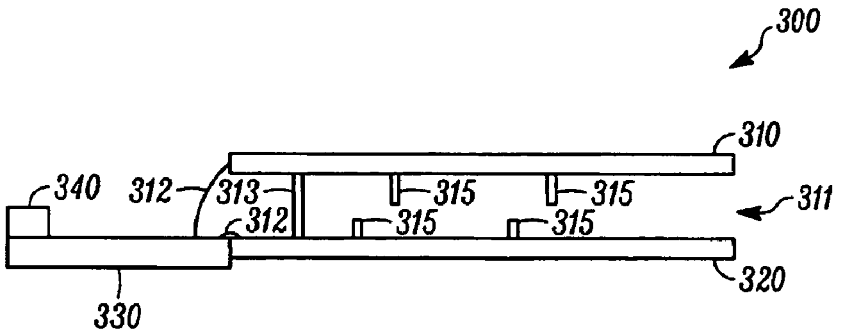
FIG. 3 is a cutaway side view of an integrated standard connector adapter card according to one embodiment of the present invention.
FIG. 4 is a table of pin mappings for the SmartMedia, MMC/SD, and Memory Stick to a 21-pin connector in accordance with one embodiment of the present invention.

FIG. 3 is a cutaway side view of an integrated standard connector adapter card according to one embodiment of the present invention. Adapter card 300, shown in FIG. 3, includes a top planar element 310 and a bottom planar element 320, both of which may be PCBs. Alternatively, the top planar element 310 and the bottom planar element 320 may be formed from molded plastic. A spacer, not shown, holds the two planar elements apart, forming port 311 into which memory media cards are inserted. In order to meet the low height requirements (thickness of PCMCIA or CF cards), the ports are registered on one opening, and contacts are distributed on both sides. Additionally, the port 311 may be formed with card stops to prevent improper insertion of memory media cards.

For one embodiment, both planar elements and the spacer between them are created from molded plastic. For such an embodiment, the molded plastic provides greater resistance to pressure applied to the outer surfaces of adapter card 300. This helps to prevent planar element 310 and planar element 320 from contacting each other and possibly damaging internal components.

Adapter 300 also includes a number of sets of contact pins, shown collectively as contact pin set 315, protruding from the lower surface of planar element 310 and from the upper surface of planar element 320. The contact pins electrically couple to corresponding contacts on a memory media card inserted into port 311. For an embodiment in which the planar elements 310 and 320 are formed from molded plastic, contact pin sets 315 may be formed from injected contacts with protruding pins. This provides a more robust contact pin than the floating contact pins of the prior art, thereby lessening the likelihood that the resiliency of the contact pin will be reduced to the point that the pin no longer contacts the inserted memory media card. Alternatively, or additionally, the contact pins may be angled or shaped such that damage due to the abrupt removal of an improperly (or properly) inserted card is reduced or eliminated. For example the terminal end of the contact pin may be angled or curved toward the planar surface from which the contact pin protrudes, or may be spherically shaped.

Adapter 300 includes planar element 330 that has standard connector 340 mounted thereon. Planar element 330 is adjacent to bottom planar element 320. Standard connector 340, which may be for example, a compact flash, PCMCIA, USB, or serial ATA connector is surface-mounted to planar element 330. Interconnects 312 that electrically connect the standard connector 340 to contact pins 315 are also located on planar element 330. The adapter connects the proper pin from the contact pins to planar element 330. Simple wiring such as individual wires, flat cables, printed-circuit board (PCB), or wiring traces can be used. In accordance with an embodiment of the present invention, the need for a straddle-mounted PCB, and its associated manufacturing costs and complexity, is eliminated. Moreover, by eliminating the layers of a straddle-mount configuration, registration accuracy is improved. For one embodiment, a single PCB may comprise bottom planar element 320 and planar element 330.

For one embodiment, a multi-memory media adapter having only 21 pins is used to accommodate various commercially available flash memory media. FIG. 4 is a table of pin mappings for the SmartMedia, MMC/SD, and Memory Stick to a 21-pin connector in accordance with one embodiment of the present invention.

Pin 18 is a ground pin for each connector. Pin 19 is a power pin for SmartMedia, while pin 20 is a power pin for MMC/SD, and Memory Stick.

The SmartMedia interface has a parallel data bus of 8 bits. These are mapped to pins 18. While no separate address bus is provided, address and data are multiplexed. Control signals for latch enables, write enable and protect, output enable, and ready handshake are among the control signals.

For the Memory Stick and MMC/SD flash-memory-card interfaces, parallel data or address busses are not present. Instead, serial data transfers occur through serial data pin DIO, which is mapped to pin 7 for the Memory Stick, and pin 10 (D0) for the MMC/SD flash-memory-card interfaces. Data is clocked in synchronization to clock MCLK and CLK, for Memory Stick and MMC/SD, respectively, on pin 21. A BS, for Memory Stick, occupies pin 6, and a command signal CMD, for MMC/SD, occupies pin 4. The Memory Stick interfaces require only 4 pins plus power and ground, while MMC/SD requires 8 pins plus power and ground.

Thus, it is possible to accommodate SmartMedia, MMC/SD, and Memory Stick with a 21-pin connector (i.e., instead of 41 pins) by multiplexing the available pins. For one embodiment, the controller chip (e.g., controller chip 231) differentiates the pin configuration for each flash memory media type. The controller may include a shifter connected to the data and clock signals from the MMC/SD and Memory Stick flash-memory cards. The shifter may clock one bit (serial) or word (parallel) of data each clock pulse. A cyclical redundancy check (CRC) can be performed on the data to detect errors.

For an alternative embodiment, a multi-memory media adapter, having only 18 pins, is used to accommodate various commercially available flash memory media including media that have recently become commercially available. Such recent additions include a miniSD card (i.e., an MMC/SD card with a smaller form factor), an MS Duo (i.e., a Memory Stick card with a smaller form factor), a Reduced Size MultiMedia Card (RSMMC), and an xD card (a controller-less Flash media, similar in function to SmartMedia).

FIG. 5 is a table of pin mappings for the xD, standard MMC/SD, standard Memory Stick, SmartMedia, miniSD, RSMMC, MMC/SD, and MS Duo to an 18-pin connector in accordance with one embodiment of the present invention.

For such an embodiment, pin 1 is a ground pin and pin 18 is a power pin for each connector. The data lines for the SmartMedia and xD interface cards have a parallel data bus of 8 bits denoted as DO-D7 that occupy pins 10-17. These data bus lines are multiplexed to serve as card-detect lines for the remaining media types.

As described in application Ser. No. 09/610,904 (now U.S. Pat. No. 6,438,638), the signal lines to the controller are normally pulled high. When a card is inserted, the card pulls its connected pins low. Detection of card type is determined by detection of which of the mapped card detect lines is pulled low as illustrated in FIG. 5, or by the (binary) state of data or other card pins mapped to a common set of controller pins as described in the aforesaid parent application. See, e.g., FIGS. 4A-E of Ser. No. 09/610,904. While no separate address bus is provided, address and data are multiplexed.

The data lines of the miniSD and RSMMC and the Memory Stick (and MS Duo) flash-memory-card interfaces are denoted as SDD0-SDD3 and MSD0-MSD3, respectively, and occupy pins 4-7.

Thus, it is possible to accommodate xD, standard MMC/SD, standard Memory Stick, SmartMedia, miniSD, RSMMC, MMC/SD, and MS Duo with an 18-pin connector by multiplexing the available pins. Again, the controller chip may differentiate the pin configuration for each flash memory media type.

Figure 6:
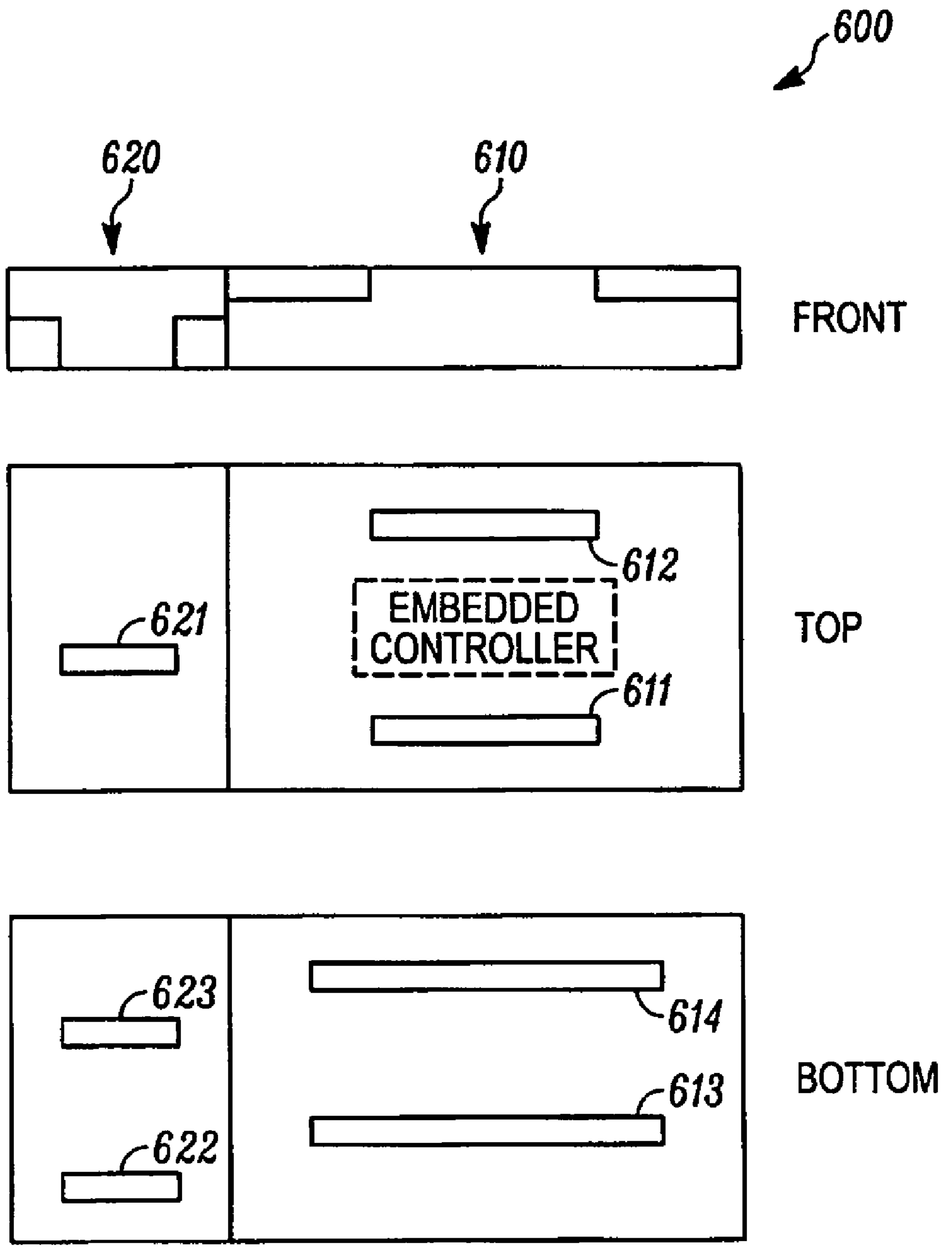
FIG. 6 illustrates an integrated standard connector adapter card, according to one embodiment of the present invention, in front view, top view, and bottom view.

FIG. 6 illustrates an integrated standard connector adapter card according to one embodiment of the present invention in front view, top view, and bottom view. Adapter card 600, shown in FIG. 6, includes two housings, namely housing 610 and housing 620. For one embodiment of the invention, the pins are in a single row. As shown from the top view of adapter card 600, a tap-front set of pins 611 in housing 610 can be used to interface to an xD card, a top-rear set of pins 612 in housing 610 can be used to interface to a SmartMedia card. A top-front set of pins 621 in housing 620 can be used to interface an RSMMC card. As shown in the bottom view of adapter card 600, a bottom-front set of pins 613 in housing 610 can be used to interface to an SD/MMC MMC/SD card, a bottom-rear set of pins 614 in housing 610 can be used to interface to a standard size Memory Stick card. A bottom-front set of pins 622 in housing 620 can be used to interface a miniSD card. A bottom-rear set of pins 623 in housing 620 can be used to interface a Memory Stick MS Duo.

Figure 7:
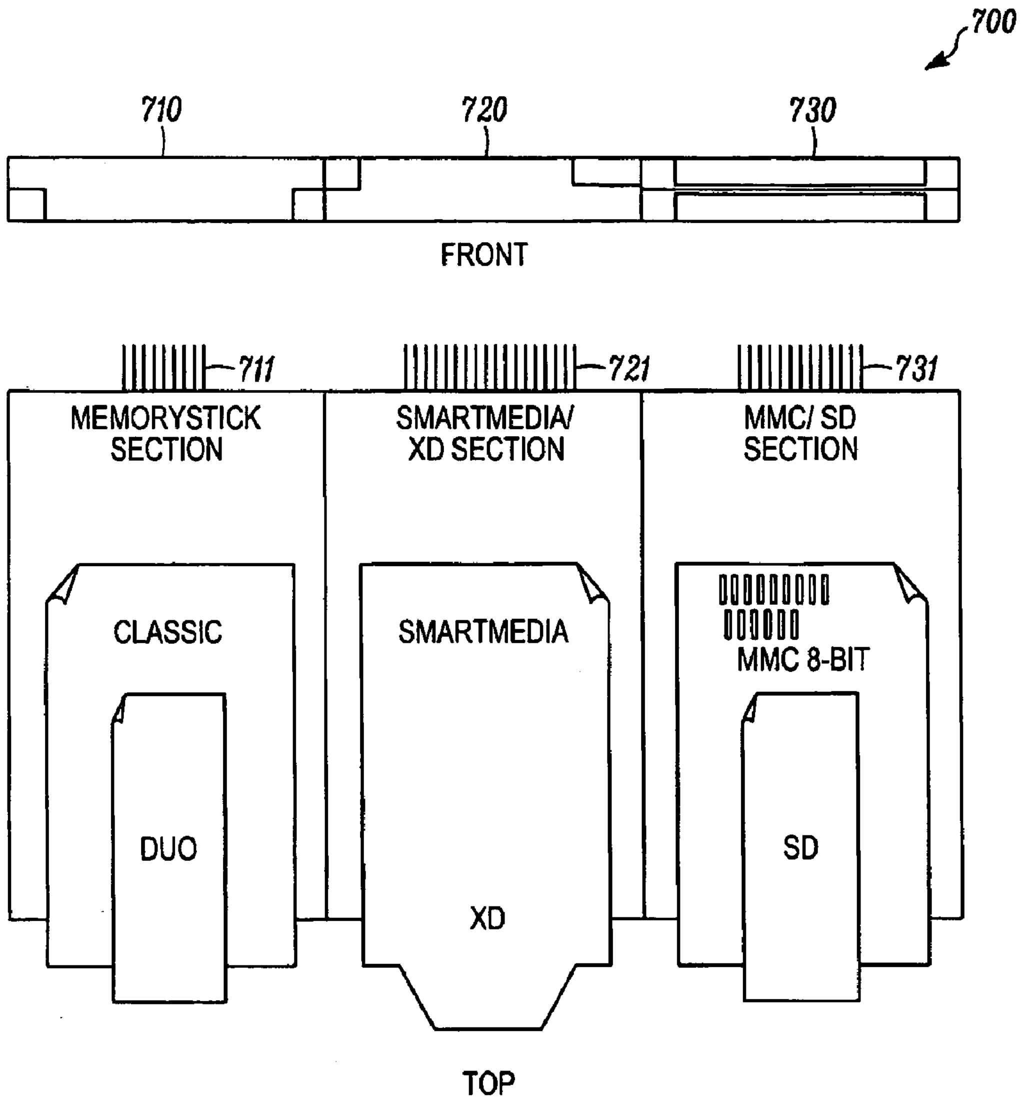
FIG. 7 illustrates an integrated standard connector adapter card, according to one embodiment of the present invention, in front view and top view.

FIG. 7 illustrates an integrated standard connector adapter card, according to one embodiment of the present invention, in front view and top view. Adapter card 700, shown in FIG. 7, includes three housings, namely section 710 (Memory Stick), section 720 (SM/xD), and section 730 (MMC/SD). This arrangement allows pins to be laid out in a planar fashion, thus effecting saving in layout and allowing for assignment of one drive for each section. The spacing is designed so that only one media can be inserted at a time. For one embodiment, the Memory Stick could be on the top portion of section 710 (with MS Duo on the bottom portion), while SmartMedia is on the top portion of section 720 with xD on the bottom portion of section 720. According to one such embodiment, the MMC (including the recently designed 8-bit MMC) could be on the top-rear portion of the MMC/SD section 730, while the SD could be on the bottom-rear portion of the MMC/SD section 730. RSMMC could be on the top-front portion of the MMC/SD section 730 and miniSD could be on the bottom-front portion of the MMC/SD section 730.

Figure 7A:
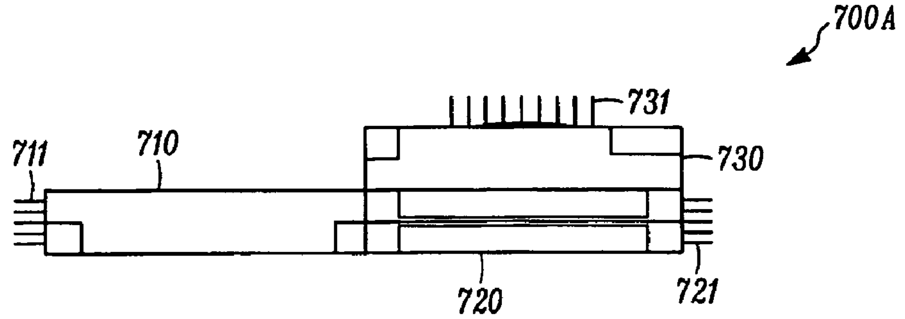
FIG. 7A illustrates an alternative embodiment of an adapter 700A in accordance with one embodiment of the invention.

FIG. 7A illustrates an alternative embodiment of an adapter 700A in accordance with one embodiment of the invention. As shown in FIG. 7A, adapter 700 includes sections 710, 720, and 730 with sections 710 and 730 positioned vertically, but section 720 stacked horizontally upon section 730. In such an embodiment, external pins 711, 721, and 731 may be positioned as shown to avoid intersection or congestion of the external connections.

As described above in reference to FIG. 3, an adapter in accordance with one embodiment of the invention includes a planar element that may have a controller chip attached to a standard connector (e.g., PCMCIA, USB, WiFi, Firewire, IDE, CF, or serial ATA connector) mounted thereon. In accordance with an alternative embodiment of the invention, the controller chip is integrated into the housing of the adapter. For example, the adapter may be formed of a single piece of molded plastic, with the controller chip and an associated memory device (e.g., ROM) embedded into the molded plastic. For such an embodiment, the continuous molded plastic that forms the adapter also forms the device package for the controller die.

General Matters

Embodiments of the present invention provide an improved configuration for a multi-memory media adapter card. For one embodiment, the adapter may comprise an injected plastic part, forming the mechanical port, as well as holding any and all contacts in its structure, thus eliminating the multiple tolerances of conventional configurations (i.e., two PCBs sandwiching a mechanical frame). For one embodiment, two half shells with integrated contacts are snapped together, allowing for a simple, but accurate mounting by means of guides for snapping them together. In particular, the total assembly of the port may be composed of two parts, a top and bottom, each with contacts and plastic, each containing part or the entire port opening, hence reducing the number of added tolerances to a maximum of one or two. By reducing the number of sub-assemblies from three or more to two or less, an easier, more precise manufacturing can be done, with only slightly higher tooling cost. However, due to the fact that it is a high-volume, commodity-type device, the higher tooling costs would be more than offset by the lower part cost, the better yield, etc. Further, by embedding the contacts in a plastic injection, such problems as metal fatigue, travel, etc., can be controlled much better, improving dramatically the life-cycle time for the port side connectors. For one embodiment of the invention, the controller and associated memory device are integrated into the adapter, rendering the adapter a complete card reader.

For one embodiment, a light pipe may be locked in place between the two half shells to conduct light from a signal lamp (e.g., LED) on the PCB to the user side of the opening, similar to networking lights sometimes integrated into networking connectors.

For one embodiment, the straddle-mount configuration is replaced with a surface mounted standard connector. This reduces the manufacturing costs and complexities associated with the straddle-mount configuration.

For one embodiment of the invention, the controller and associated memory device are integrated into the adapter rendering the adapter a complete card reader.

Embodiments of the present invention have been described in reference to flash media such as xD, standard MMC/SD, standard Memory Stick, SmartMedia, miniSD, RSMMC, and MMC/SD, and MS Duo. In general, embodiments of the invention are applicable to any generic flash media.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

The invention claimed is:

1. Apparatus comprising:

a housing having a port and a surface;

a plurality of sets of contact pins mounted on said surface at locations adapted to interface with the electrical contacts of a plurality of different type memory media cards when inserted into said port;

a set of signal lines connected to a controller, the number of signal lines being fewer than the number of contact pins; the signal lines located between the controller and an interconnection means;

said interconnection means being located between the signal lines and the plurality of sets of contact connecting said signal lines to said one or more contact pins; and means for mapping power, ground or data signals between said signal lines and said contact pins depending upon the identification of the type of memory card inserted into said port; wherein the means for mapping comprises a controller.

2. Apparatus according to claim 1 where said controller comprises means for determining the type of memory card inserted into said port.

3. Apparatus according to claim 1 wherein said interconnection means is selected from a group consisting of simple wires, flat cables, printed circuit board interconnections, or wiring traces.

* * * * *